(12) United States Patent
Oishi

(10) Patent No.: US 7,633,346 B2
(45) Date of Patent: Dec. 15, 2009

(54) TRANSCONDUCTANCE COMPENSATING BIAS CIRCUIT AND AMPLIFIER

(75) Inventor: Kazuaki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 12/183,723

(22) Filed: Jul. 31, 2008

(65) Prior Publication Data

US 2009/0108941 A1   Apr. 30, 2009

(30) Foreign Application Priority Data

Oct. 25, 2007   (JP) .............................. 2007-277628

(51) Int. Cl.
*H03F 3/04* (2006.01)
(52) U.S. Cl. .................. 330/296; 330/285; 330/288
(58) Field of Classification Search ................. 330/285, 330/288, 296
See application file for complete search history.

(56) References Cited

U.S. PATENT DOCUMENTS

| | | | |
|---|---|---|---|
| 7,119,620 B2 * | 10/2006 | Pan | 330/285 |
| 7,268,528 B2 | 9/2007 | Noda | |
| 7,304,539 B2 * | 12/2007 | Tsurumaki et al. | 330/296 |

FOREIGN PATENT DOCUMENTS

| | | |
|---|---|---|
| JP | 9307369 | 11/1997 |
| JP | 2006109349 | 4/2006 |
| JP | 2007148530 | 6/2007 |

OTHER PUBLICATIONS

Behzad Razavi. "Design of Analog CMOS Integrated Circuits" McGraw-Hill Higher Education, International Edition 2001.

* cited by examiner

*Primary Examiner*—Khanh V Nguyen
(74) *Attorney, Agent, or Firm*—Katten Muchin Rosenman LLP

(57) ABSTRACT

A transconductance compensating bias circuit is disclosed that includes a first field-effect transistor (FET) having a first electrode, a second electrode, and a gate connected to the first electrode, wherein a reference current flows through the first and second electrodes; a second FET having a first electrode, a second electrode, and a gate connected to the gate of the first FET, wherein a bias current flows through the first and second electrodes; a resistor connected to the second electrode of the first or second FET; and a comparison part configured to output a signal corresponding to the result of comparison of the first potential of the first electrode of the first FET and the second potential of the first electrode of the second FET. The reference current and the bias current are controlled by the output signal of the comparison part so as to equalize the first and second potentials.

12 Claims, 10 Drawing Sheets

FIG.10

VARIATIONS OF "Gm × R"

| | MIN | TYP | MAX |
|---|---|---|---|
| CONVENTIONAL Gm COMPENSATING BIAS CIRCUIT | −17.3% | 0% | 39.4% |
| Gm COMPENSATING BIAS CIRCUIT OF EMBODIMENT | −4.1% | 0% | 8.6% |

TRANSCONDUCTANCE COMPENSATING BIAS CIRCUIT AND AMPLIFIER

BACKGROUND OF THE INVENTION

1. Field of the Invention

The present invention relates to a transconductance compensating bias circuit and an amplifier.

2. Description of the Related Art

FIG. 1 is a diagram showing an amplifier circuit. The amplifier circuit includes a load resistor 101 and a field-effect transistor (FET) 103 connected in series between a high potential source and a low potential source. The drain of the FET 103 is connected to the output of the amplifier circuit. The source of the FET 103 is connected to the low potential source. The gate of the FET 103 is connected to a signal source S through a capacitor C. Further, the gate of the FET 103 is biased by a transconductance compensating bias circuit 105.

A change ΔIamp in the current flowing through the FET 103 is proportional to a change in the gate voltage Vin in a small signal region as follows:

$$\Delta Iamp = Gm \times \Delta Vin, \tag{1}$$

where Gm is a constant of proportionality and is referred to as "transconductance."

Accordingly, a change ΔVout in the voltage applied to the load resistor 101 is given by:

$$\Delta Vout = R \times \Delta Iamp = R \times Gm \times \Delta Vin, \tag{2}$$

where R is the resistance of the load resistor 101. The gain of the amplifier is defined by R×Gm.

This type of amplifier circuit is biased by the transconductance compensating bias circuit 105 so as to cause the gain R×Gm to be a constant value. The transconductance compensating bias circuit 105 suitably biases the gate of the FET 103 so as to ensure that the transconductance Gm of the FET 103 is inversely proportional to the resistance R of the load resistor 101. By causing the gain R×Gm to be a constant value, it is possible to reduce a variation in the amplification characteristic originating from the manufacturing process of the FET 103 or due to a change in temperature at the time of operation. This is because in general, resistors of the same type change in the same manner in response to a change in the manufacturing process in an integrated circuit such as LSI.

FIG. 2 is a diagram showing a circuit used in the transconductance compensating bias circuit 105 of FIG. 1. The transconductance compensating bias circuit 105 includes first and second p-channel FETs 201 and 203 and first and second n-channel FETs 205 and 207. The first p-channel FET 201 has a source connected to a high potential source (for example, a 3 V constant potential source Vdd), a gate, and a drain connected to the gate. The first n-channel FET 205 has a drain connected to the drain of the first p-channel FET 201, a gate, and a source connected to a low potential source through a resistor Rs. The second p-channel FET 203 has a source connected to the high potential source, a gate connected to the gate of the first p-channel FET 201, and a drain. The second n-channel FET 207 has a drain connected to the drain of the second p-channel FET 203, a gate connected to the drain, and a source connected to the low potential source.

In general, the transconductance compensating bias circuit 105 forms a current mirror circuit, so that a reference current Iref flowing through the first p-channel FET 201 and the first n-channel FET 205 is reflected in a bias current Iout flowing through the second p-channel transistor 203 and the second n-channel transistor 207. In FIG. 2, W and L indicate the width and length, respectively, of the gate of the FET, and K represents the scale factor of the FET. In this case, if the reference current Iref and the bias current Iout are equal, the transconductance gm of the second n-channel FET 207 can usually be approximated as follows:

$$gm = \frac{2}{Rs}\left(1 - \frac{1}{\sqrt{K}}\right) \propto \frac{1}{Rs}, \tag{3}$$

where Rs represents the resistance of the resistor Rs connected to the source of the first n-channel FET 205.

As shown in the above-described formula (3), the transconductance gm of the second n-channel FET 207 is inversely proportional to the resistance of the resistor Rs if Iref=Iout. Accordingly, it is possible to stabilize the gain of the amplifier circuit by causing a current proportional to Iref (Iout) to flow through the amplifier circuit (for example, Iamp of FIG. 1). The technique of using gm being proportional to 1/Rs in the case of Iref=Iout is described in, for example, Razavi, B.; Design of Analog CMOS Integrated Circuit, p. 379.

FIG. 3 is a graph showing the relationship between drain current and drain voltage with respect to the first and second n-channel FETs 205 and 207 of FIG. 2. If the resistance $R_{DS}$ between the source and drain of an FET is relatively large, the drain current hardly changes even if the drain voltage changes to some extent. Accordingly, even if there is some difference between the drain voltages $V_1$ and $V_2$ of the first and second n-channel FETs, respectively, the relationship of Iref=Iout is maintained, and the above-described approximation of $gm \propto 1/Rs$ holds, so that the above-described intended operation is ensured.

As the source-drain resistance $R_{DS}$ has become relatively small with progress in the miniaturization of transistors, a change in the drain current in response to a change in the drain voltage cannot be ignored. Therefore, the drain voltages $V_1$ and $V_2$ of the first and second n-channel FETs 205 and 207, respectively, are required to be equal, for otherwise, Iref and Iout are not equal (Iref≠Iout) because of the voltage difference.

Further, there may be a change in the potential difference between the drain voltages $V_1$ and $V_2$ of the first and second n-channel FETs 205 and 207, respectively, because of a change in the manufacturing process or operating temperature. In this case, the difference between Iref and Iout also changes, so that the ratio of gm to 1/Rs also changes. As a result, the above-described intended operation is not ensured.

SUMMARY OF THE INVENTION

Embodiments of the present invention may solve or reduce one or more of the above-described problems.

According to one embodiment of the present invention, there are provided a transconductance compensating bias circuit in which one or more of the above-described problems may be solved or reduced and an amplifier including the transconductance compensating bias circuit.

According to one embodiment of the present invention, there are provided a transconductance compensating bias circuit that stabilizes the bias of a field-effect transistor forming an amplifier to stabilize the gain of the amplifier, and an amplifier including the transconductance compensating bias circuit.

According to one embodiment of the present invention, a transconductance compensating bias circuit compensating for a transconductance of a field-effect transistor is provided that includes a first field-effect transistor having a first electrode, a second electrode, and a gate connected to the first electrode, wherein a reference current flows through the first and second electrodes; a second field-effect transistor having a first electrode, a second electrode, and a gate connected to the gate of the first field-effect transistor, wherein a bias current flows through the first and second electrodes; a resistor connected to one of the second electrode of the first field-effect transistor and the second electrode of the second field-effect transistor; and a comparison part configured to output a signal corresponding to a result of comparison of a first potential of the first electrode of the first field-effect transistor and a second potential of the first electrode of the second field-effect transistor, wherein the reference current and the bias current are controlled by the output signal of the comparison part so as to equalize the first potential and the second potential.

According to one embodiment of the present invention, an amplifier is provided that includes an amplifier circuit having a field-effect transistor connected to a load resistor; and a transconductance compensating bias circuit configured to apply a bias to a gate of the field-effect transistor, wherein the transconductance compensating bias circuit includes a first field-effect transistor having a first electrode, a second electrode, and a gate connected to the first electrode, wherein a reference current flows through the first and second electrodes; a second field-effect transistor having a first electrode, a second electrode, and a gate connected to the gate of the first field-effect transistor, wherein a bias current flows through the first and second electrodes; a resistor connected to the second electrode of the first field-effect transistor; and a comparison part configured to output a signal corresponding to a result of comparison of a first potential of the first electrode of the first field-effect transistor and a second potential of the first electrode of the second field-effect transistor, wherein the reference current and the bias current are controlled by the output signal of the comparison part so as to equalize the first potential and the second potential.

According to one aspect of the present invention, it is possible to stabilize the bias of a field-effect transistor forming an amplifier and to stabilize the gain of the amplifier.

BRIEF DESCRIPTION OF THE DRAWINGS

Other objects, features and advantages of the present invention will become more apparent from the following detailed description when read in conjunction with the accompanying drawings, in which:

FIG. 10 is a diagram showing the results of a simulation according to the first embodiment of the present invention.

DETAILED DESCRIPTION OF THE PREFERRED EMBODIMENTS

According to one aspect of the present invention, a comparison circuit outputs a signal corresponding to the result of comparing the first potential of a first electrode of a first field-effect transistor (FET) through which a reference current flows and the second potential of a first electrode of a second field-effect transistor (FET) through which a bias current flows. The reference current and the bias current are controlled by this signal so as to be equalized. Thereby, the bias of an FET forming an amplifier can be stabilized, so that the gain of the amplifier can be stabilized.

In order to keep the gain of the amplifier constant, the transconductance of the first and second FETs is controlled so as to be inversely proportional to a resistor connected to the source of the first FET.

A phase compensator circuit may be provided between an input and the output of the comparison circuit. The phase compensator circuit may be formed of a capacitor.

The first FET and the second FET may be n-channel FETS, a p-channel FET may be provided between a high potential source and each of the first electrodes of the first and second FETs, and the first FET may be connected to a low potential source through the resistor. Further, the output signal of the comparison circuit may be input to the gate of each p-channel FET.

The comparison circuit may be formed of an operational amplifier. The comparison circuit may include a third FET having a gate to which the first potential is applied, a fourth FET having a gate to which the second potential is applied, a fifth FET having an electrode connected to the fourth FET and outputting the signal corresponding to the result of the comparison, and a sixth FET having a gate connected to the gate of the fifth FET and an electrode connected to the gate of the sixth FET and to the third FET.

A description is given below, with reference to the accompanying drawings, of embodiments of the present invention.

First Embodiment

Figure 1:
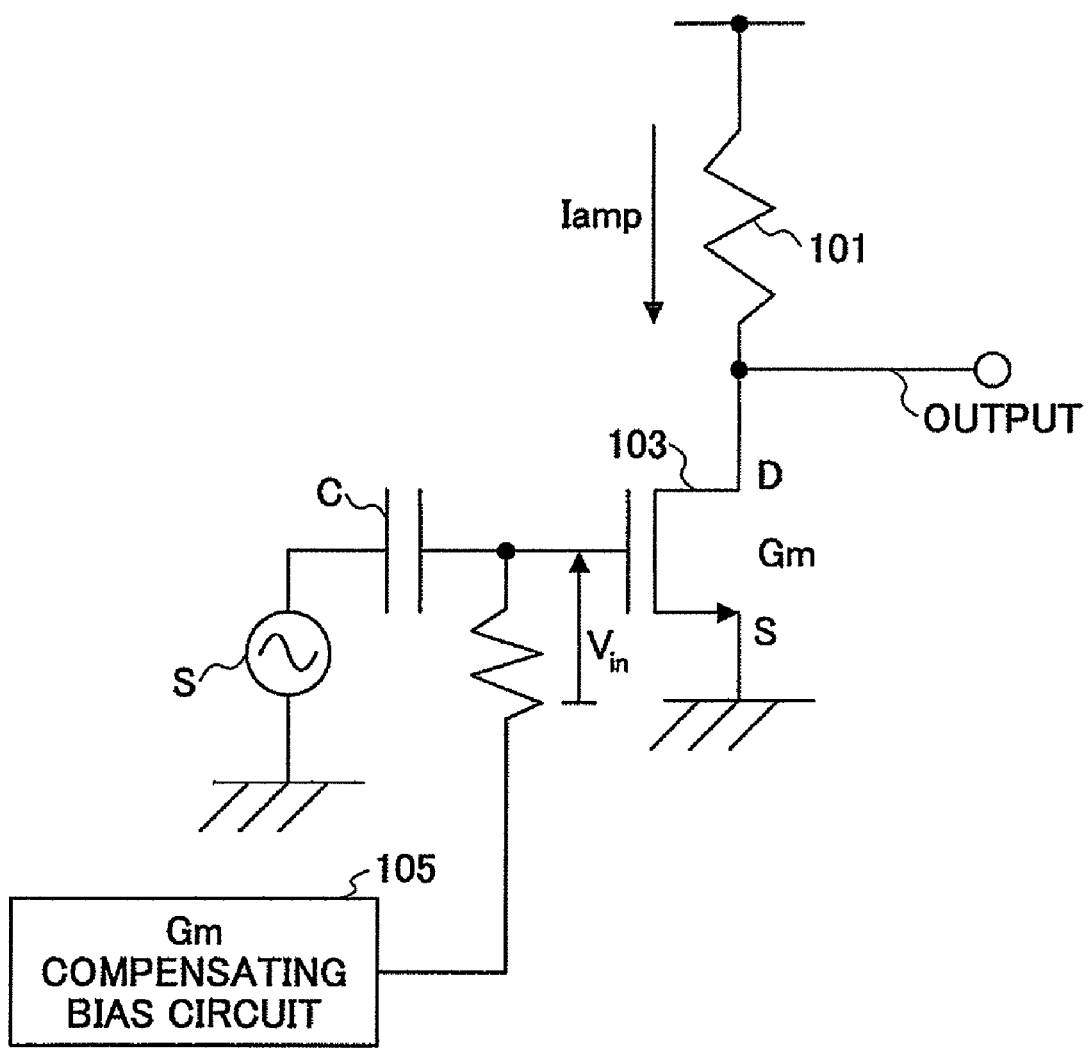
FIG. 1 is a diagram showing an amplifier circuit.
Figure 4:
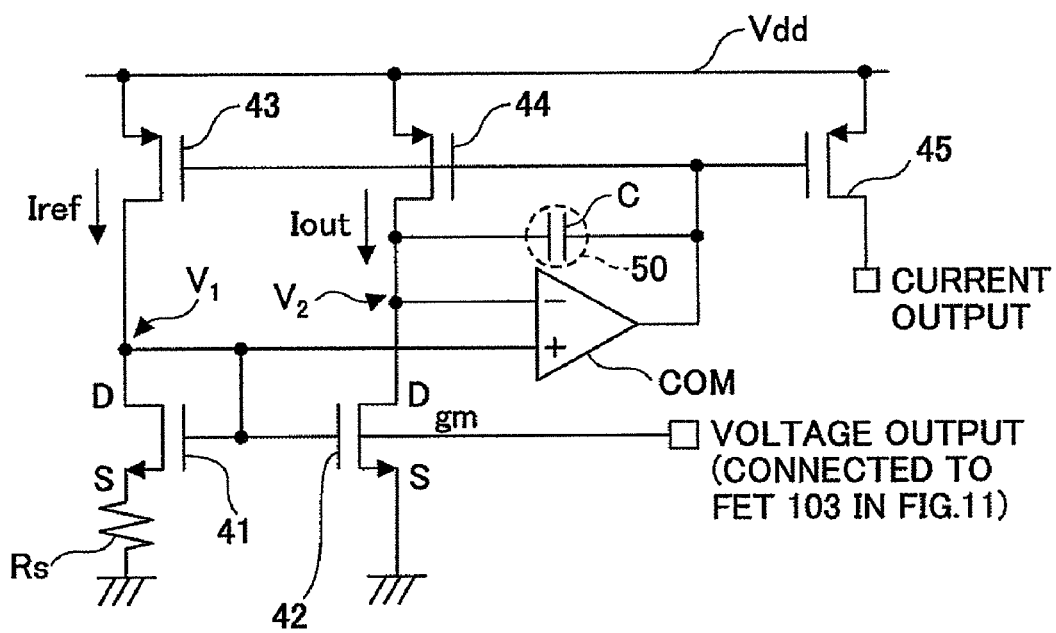
FIG. 4 is a diagram showing a transconductance compensating bias circuit according to a first embodiment of the present invention.

FIG. 4 is a diagram showing a transconductance compensating bias circuit according to a first embodiment of the present invention. The transconductance compensating bias circuit may be used for such an amplifier circuit as shown in FIG. 1 or for other circuits.

Referring to FIG. 4, the transconductance compensating bias circuit includes first through fifth FETs 41 through 45. The first FET 41, which is an n-channel FET, has a source connected to a low potential source (for example, ground [GND]) through a resistor Rs, a gate, and a drain connected to the gate. The second FET 42, which is also an n-channel FET, has a source connected to the low potential source, a gate connected to the gate of the first FET 41, and a drain. The third FET 43, which is a p-channel FET, has a drain connected to the drain of the first FET 41, a gate, and a source connected to a high potential source such as Vdd. The fourth FET 44, which is also a p-channel FET, has a drain connected to the drain of the second FET 42, a gate connected to the gate of the third FET 43, and a source connected to the high potential source. The fifth FET 45, which is a p-channel FET, has a source connected to the high potential source, a gate connected to the gates of the third and fourth FETs 43 and 44, and a drain.

The transconductance compensating bias circuit of FIG. 4 further includes a comparison circuit COM. The comparison circuit COM has a non-inverting input (+) connected to the drain ($V_1$) of the first FET 41, an inverting input (−) connected to the drain ($V_2$) of the second FET 42, and an output connected to the gates of the third and fourth FETs 43 and 44. The transconductance compensating bias circuit also includes a phase compensation circuit 50 formed of a capacitor C between the output and the inverting input of the comparison circuit COM. The output of the transconductance compensating bias circuit may be taken from the drain of the fifth FET 45 (current output), the drain of the second FET 42 (voltage output), or the drain of the first FET 41 (voltage output). This is because their (drain) voltages (currents) are controlled to be equal according to this embodiment.

Figure 2:
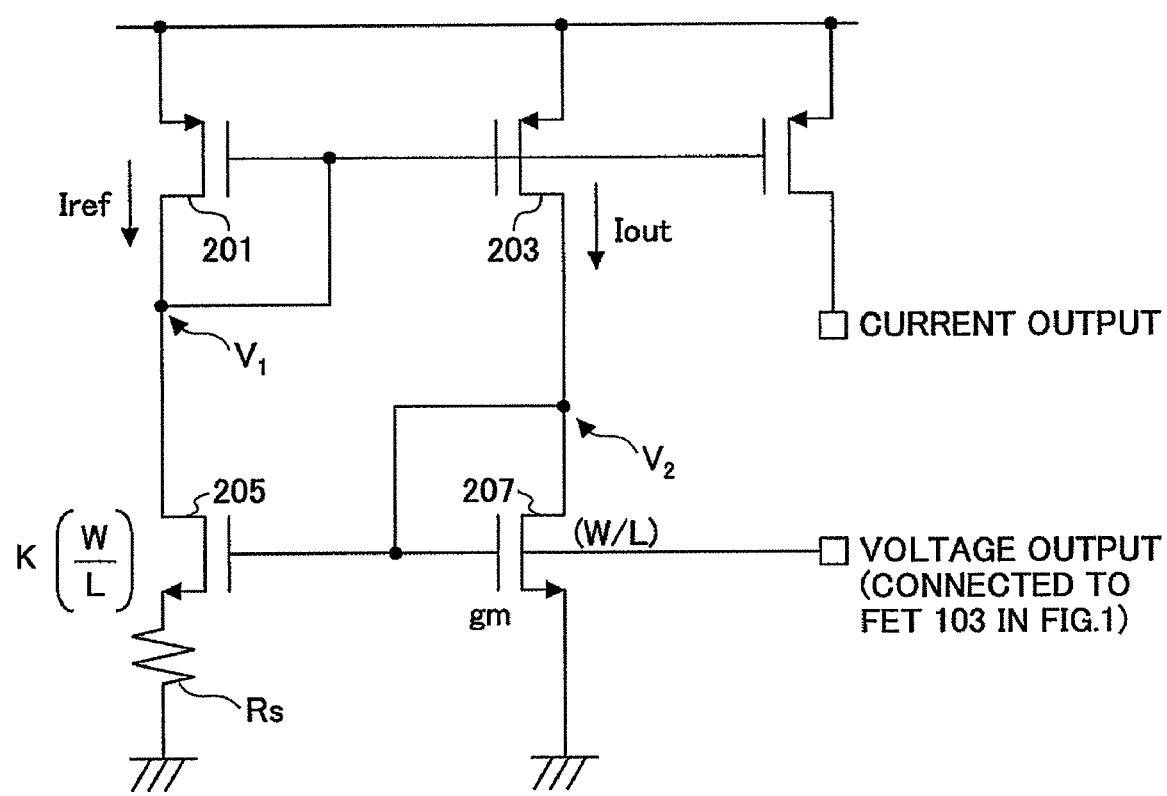
FIG. 2 is a diagram showing a conventional transconductance compensating bias circuit used in the amplifier circuit of FIG. 1.
Figure 3:
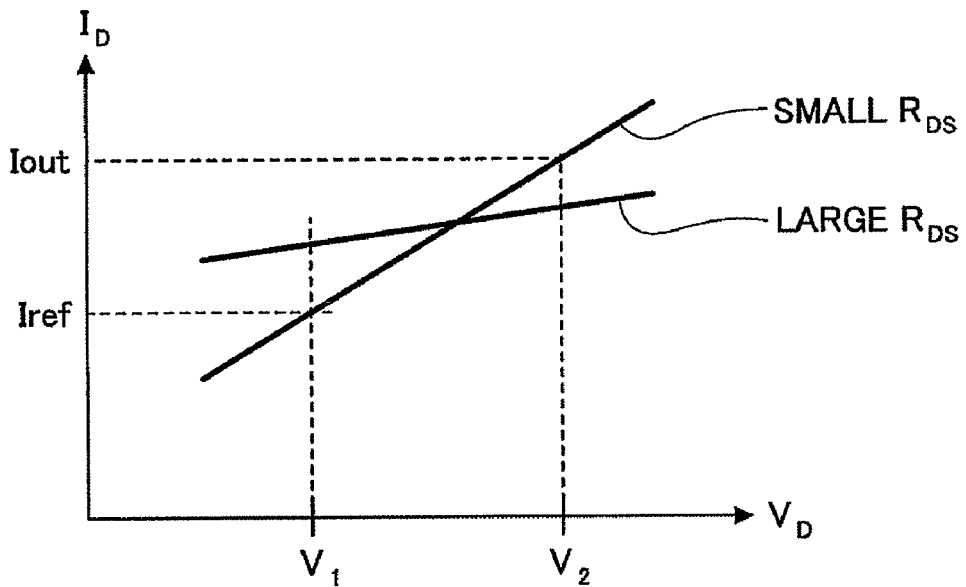
FIG. 3 is a graph schematically showing the drain current-voltage characteristics of an FET.

Like the circuit of FIG. 2, the transconductance compensating bias circuit of FIG. 4 also forms a current mirror circuit, so that a reference current Iref flowing through the third FET 43 and the first FET 41 is reflected in a bias current Iout flowing through the fourth FET 44 and the second FET 42. If the reference current Iref and the bias current Iout are equal, the transconductance gm of the second FET 42 is proportional to 1/Rs, where Rs represents the resistance of the resistor Rs.

Accordingly, if a current proportional to Iref (Iout) is fed to the transistor forming the amplifier circuit, it is possible to stabilize the gain of the amplifier circuit.

According to the transconductance compensating bias circuit of FIG. 4, the drain voltages $V_1$ and $V_2$ of the first and second FETs 41 and 42, respectively, are controlled to be constantly equal. For an explanation of this, consideration is given to a model where the first and second FETs 41 and 42 are replaced with respective equivalent circuits.

Figure 5:
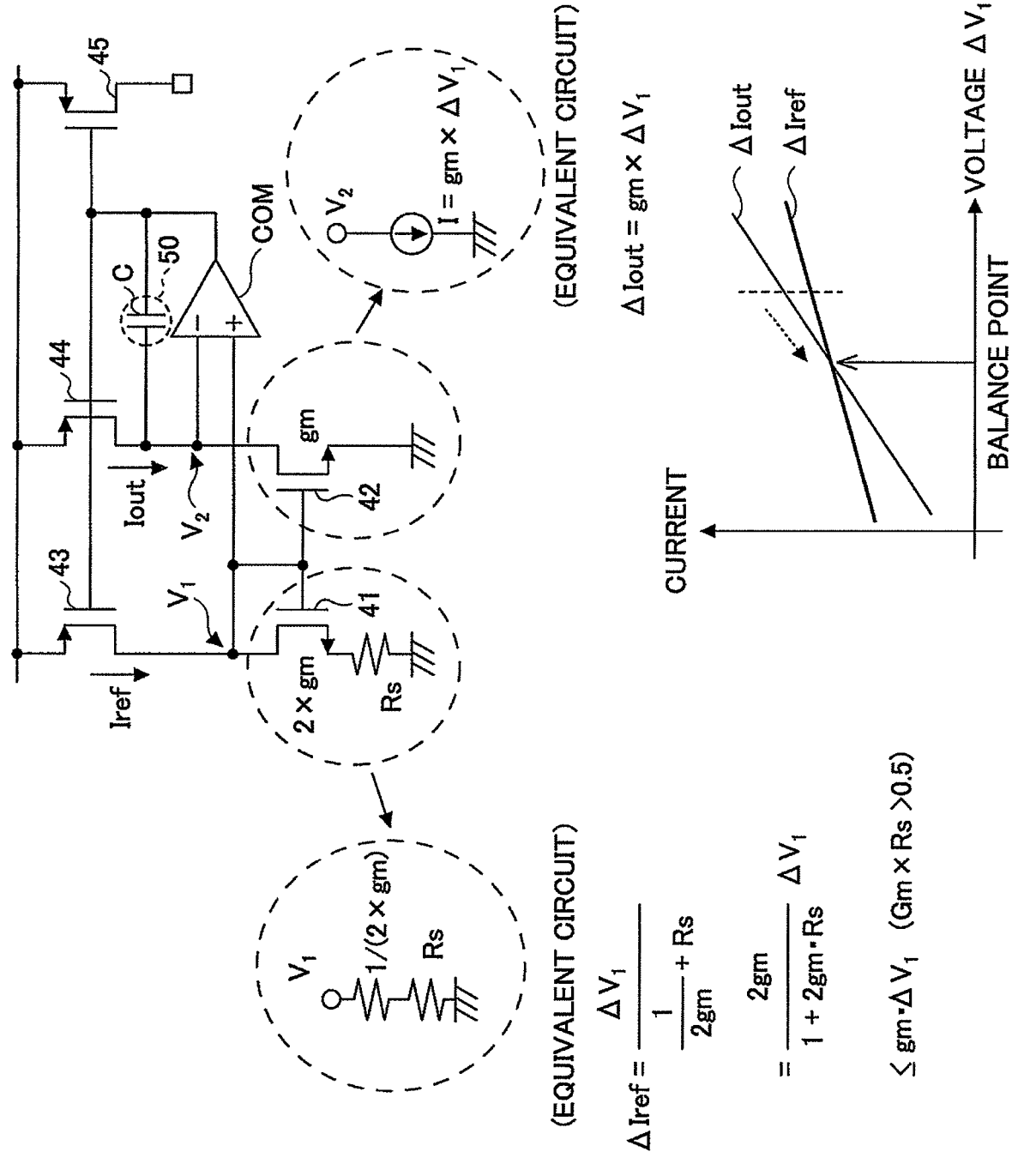
FIG. 5 is a diagram for illustrating an operation of the transconductance compensating bias circuit according to the first embodiment of the present invention.

FIG. 5 is a diagram for illustrating an operation of the transconductance compensating bias circuit according to this embodiment.

As shown in FIG. 5, the first FET 41 having its gate and drain connected may be considered as a resistor circuit having a value of 1/(2 gm), where the scale factor K is assumed to be 4. In this case, the drain voltage change $\Delta V_1$ of the first FET 41 is given by:

$$\Delta V_1 = (1/(2gm) + Rs) \times \Delta Iref, \quad (4)$$

where Rs represents the resistance of the resistor Rs. Accordingly, $$\Delta Iref = 2gm/(1 + 2gm \times Rs)\Delta V_1 \leq gm \times \Delta V_1, \quad (5)$$

where it is assumed that gm×Rs>1/2.

On the other hand, the second FET 42 may be considered as a current source controlled by $\Delta V_1$. Accordingly, $$\Delta Iout = gm \times \Delta V_1. \quad (6)$$

The expressions (5) and (6) show that in light of current with respect to voltage, the change of the reference current ΔIref is more gradual than the change of the bias current ΔIout. (See the Graph at the Bottom in FIG. 5.)

It is assumed that Iref has become smaller than Iout (Iref<Iout). In this case, if the third and fourth FETS 43 and 44 have substantially the same source-drain resistance $R_{DS}$, $V_1$ becomes greater than $V_2$ ($V_1 > V_2$), and this potential difference is input to the comparison circuit COM. In the illustrated case, a relatively large voltage is applied to the non-inverting input (+) of the comparison circuit COM, and a relatively small voltage is applied to the inverting input (−) of the comparison circuit COM. The comparison circuit COM outputs a comparison output signal according to the relationship (difference) in magnitude between these voltages. In the illustrated case, the comparison circuit COM outputs a positive signal according to the potential difference. The comparison output signal is input to the gate of each of the third and fourth FETs 43 and 44. According to this embodiment, the third and fourth FETS 43 and 44 are p-channel FETs. Accordingly, the currents of the third and fourth FETs 43 and 44 change in a direction to decrease. The reference current Iref and the bias current Iout flowing through the third and fourth FETs 43 and 44, respectively, are reduced so as to approach Iref=Iout as indicated by broken arrow in the graph of FIG. 5, so that the condition finally converges to Iref=Iout and $V_1 = V_2$.

On the other hand, it is assumed that Iref has become larger than Iout (Iref>Iout). In this case, $V_1$ becomes smaller than $V_2$ ($V_1 < V_2$), and this potential difference is input to the comparison circuit COM. In the illustrated case, a relatively small voltage is applied to the non-inverting input (+) of the comparison circuit COM, and a relatively large voltage is applied to the inverting input (−) of the comparison circuit COM. The comparison circuit COM outputs a comparison output signal according to the relationship (difference) in magnitude between these voltages. In the illustrated case, the comparison circuit COM outputs a negative signal according to the potential difference. The comparison output signal is input to the gate of each of the third and fourth FETs 43 and 44. Since the third and fourth FETS 43 and 44 are p-channel FETs, the currents of the third and fourth FETs 43 and 44 change in a direction to increase. The reference current Iref and the bias current Iout flowing through the third and fourth FETs 43 and 44, respectively, increase so as to approach Iref=Iout as shown in the graph of FIG. 5, so that the condition finally converges to Iref=Iout and $V_1 = V_2$.

According to this embodiment, the reference current Iref and the bias current Iout are increased or reduced in accordance with the comparison output signal corresponding to the potential difference (including polarity) input to the comparison circuit COM, so that Iref=Iout is achieved. Accordingly, Iref=Iout is maintained with accuracy, so that Eq. (3) holds with accuracy. Thus, the transconductance compensating bias circuit can stably apply a bias to the amplifier circuit at a subsequent stage.

As described above, the phase compensation circuit 50 is provided between the inverting input and the output of the comparison circuit COM. In the illustrated case, the phase compensation circuit 50 is formed of the capacitor C only. Alternatively, the phase compensation circuit 50 may be formed of any proper combination of two or more of a capacitor, an inductor, a resistor, etc., such as a series circuit of a capacitor and a resistor. Further, the phase compensation circuit 50 may alternatively be provided between the non-inverting input and the output of the comparison circuit COM. This is because it is satisfactory if the phases of the reference current Iref and the bias current Iout are properly determined relative to each other so as to prevent occurrence of oscillation.

Figure 6:
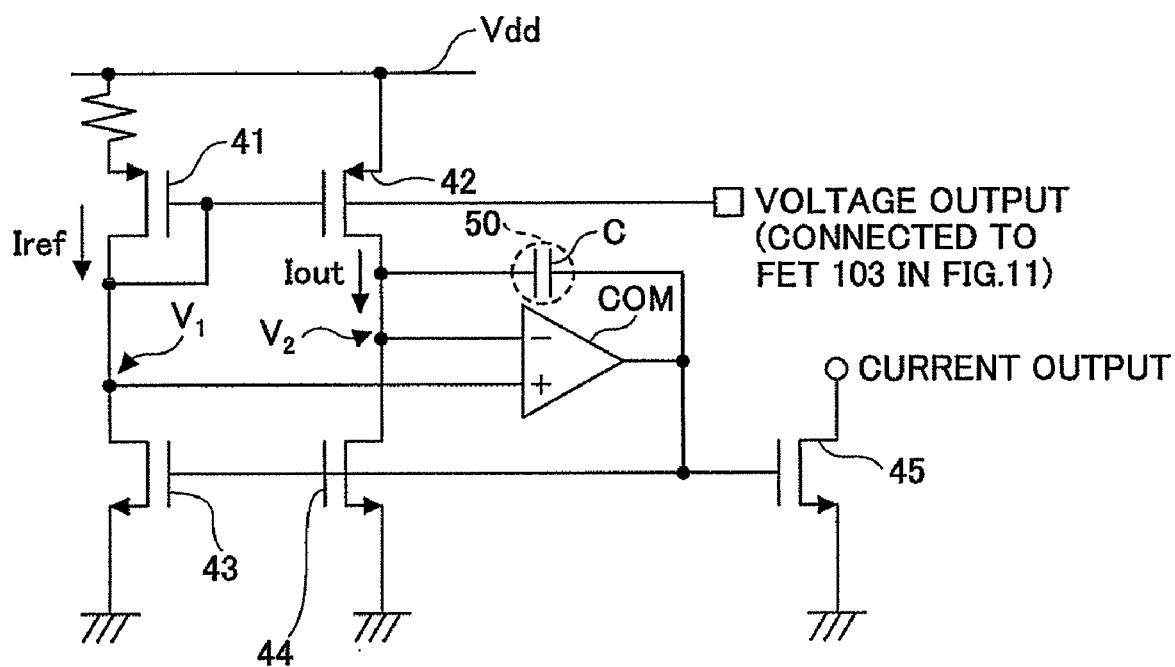
FIG. 6 is a diagram showing another configuration of the transconductance compensating bias circuit according to the first embodiment of the present invention.

FIG. 6 is a diagram showing a variation of the transconductance compensating bias current of FIG. 4. In the circuit configuration of FIG. 6, the first and second FETs are p-channel FETs, and the third through fifth FETs 43 through 45 are n-channel FETs. The output of the transconductance compensating bias current may be taken from the p-channel fifth FET 45 in the circuit configuration of FIG. 4, while the output of the transconductance compensating bias current may be taken from the n-channel fifth FET 45 in the circuit configuration of FIG. 6.

The comparison circuit COM shown in FIG. 4 may be formed of any appropriate circuit configured to compare input signals and output a signal that represents the result of the comparison. For example, the comparison circuit COM may be formed of an operational amplifier.

Figure 7:
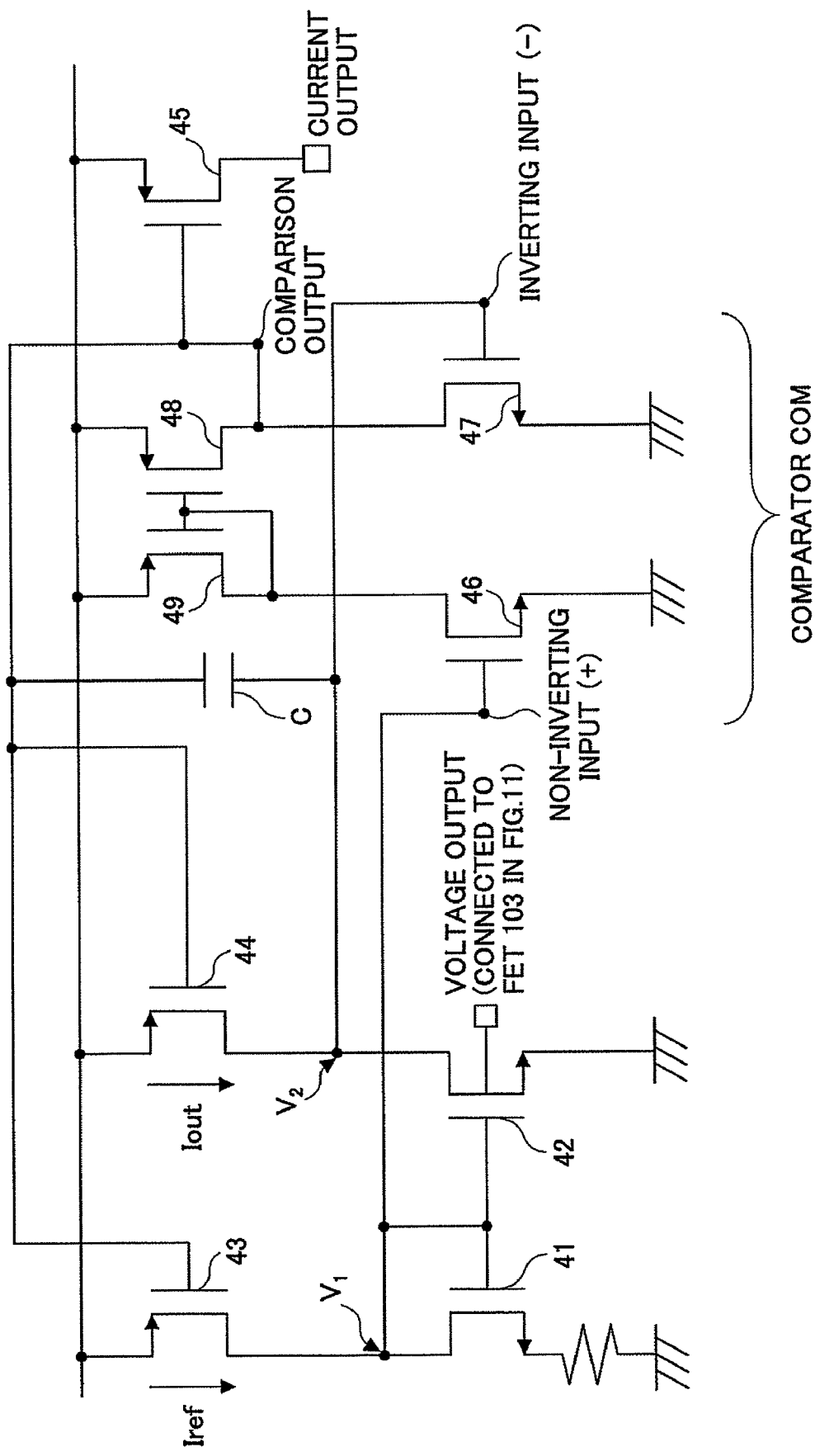
FIG. 7 is a diagram showing a configuration of a comparison circuit according to the first embodiment of the present invention.

FIG. 7 is a diagram showing a configuration of the comparison circuit COM according to this embodiment. In FIG. 7, the same elements as those described with reference to FIG. 4 are referred to by the same reference numerals. The comparison circuit COM includes sixth through ninth FETs 46 through 49. The sixth FET 46, which is an n-channel FET, has a source connected to the low potential source, a gate to which the drain voltage (first voltage $V_1$) of the first FET 41 is applied, and a drain. The seventh FET 47, which is an n-channel FET, has a source connected to the low potential source, a gate to which the drain voltage (second voltage $V_2$) of the second FET 42 is applied, and a drain. The eighth FET 48, which is a p-channel FET, has a drain connected to the drain of the seventh FET 47, a gate, and a source connected to the high potential source. The drain of the eighth FET 48 serves as an output that outputs a signal corresponding to the result of the comparison. The ninth FET 49, which is a p-channel FET, has a drain connected to the drain of the sixth FET 46, a gate connected to the drain and to the gate of the eighth FET 48, and a source connected to the high potential source.

Figure 8:
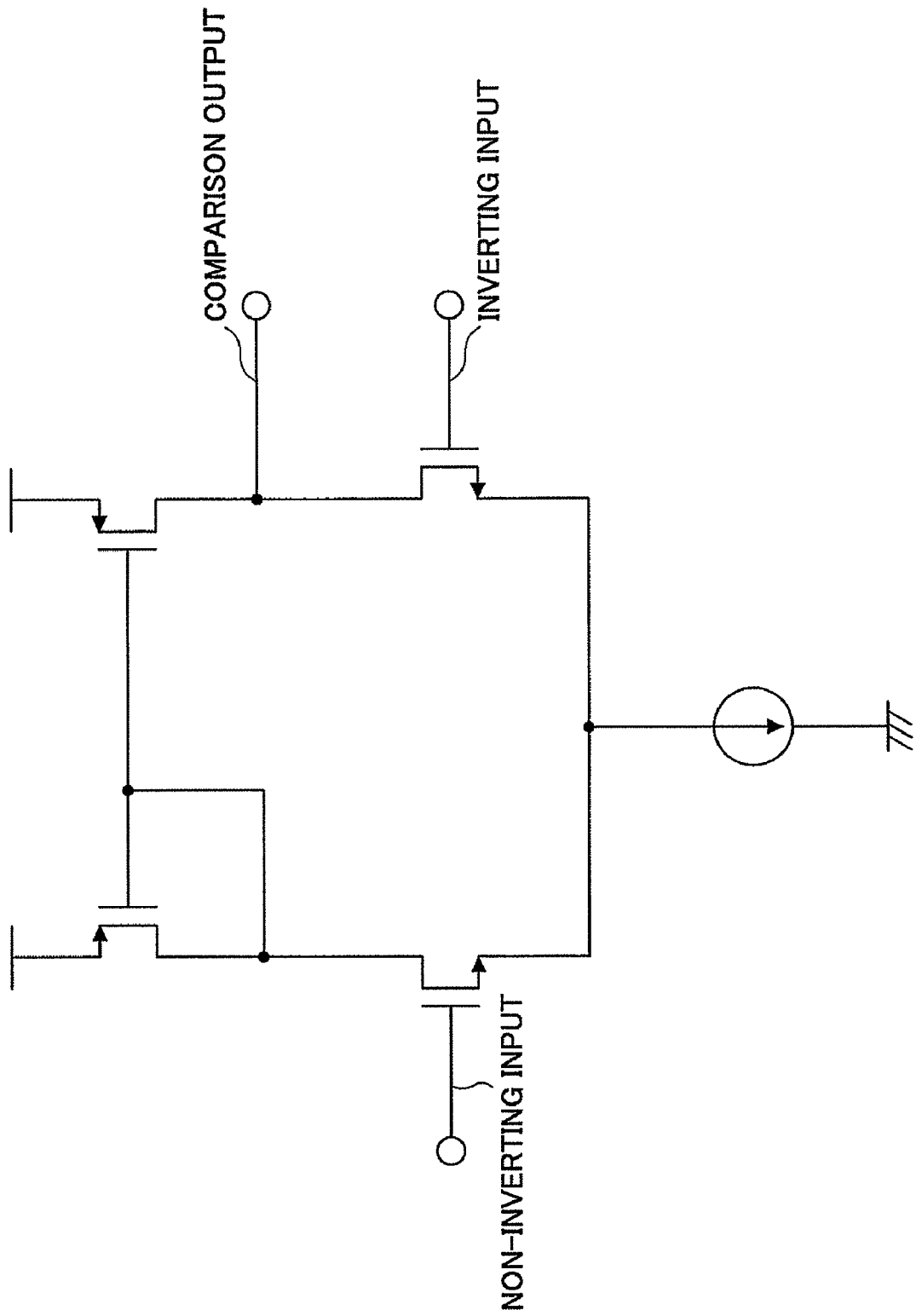
FIG. 8 is a diagram showing a comparison circuit configuration for reference.
Figure 9:
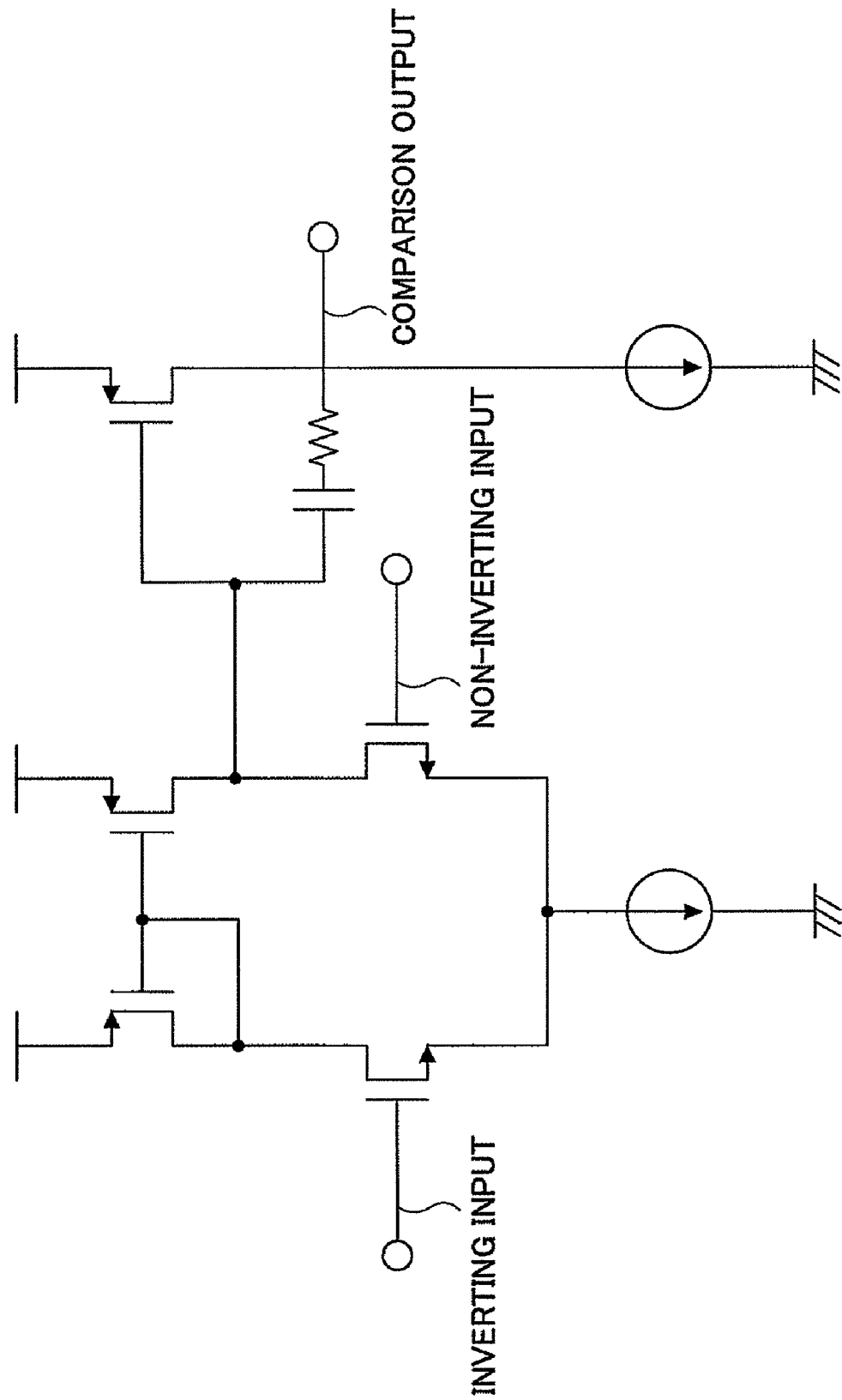
FIG. 9 is a diagram showing another comparison circuit configuration for reference.

There are various types of operational amplifiers, and common types have a differential pair biased by a constant current source to stabilize operations as shown in FIG. 8 and FIG. 9.

However, according to this embodiment, the currents flowing through the first, second, sixth, and seventh FETs 41, 42, 46, and 47 are equal or at least proportional to one another. Accordingly, there is no need for a constant current source for operational stabilization. Accordingly, a simple configuration as shown in FIG. 7 may be adopted for the comparison circuit COM.

FIG. 10 shows the results of a simulation of the case of using the transconductance compensating bias circuit of FIG. 4 of this embodiment. As described above, the gain is expressed by the product of the transconductance Gm of the FET and the resistance R of the load resistor of the amplifier circuit in the amplifier (Gm×R). In the simulation, deviations of a maximum "Gm×R" (MAX) and a minimum "Gm×R" (MIN) from a standard typical gain "Gm×R" (TYP) are calculated in the case where a large number of transconductance compensating bias circuits are manufactured. Variations in the manufacturing process and operating temperature are also considered. According to the conventional transconductance compensating bias circuit, the minimum "Gm×R" deviates −17.3% from the typical value and the maximum "Gm×R" deviates +39.4% from the typical value, so that the range of variation is as much as 56.7% of the typical value. On the other hand, according to the transconductance compensating bias circuit of this embodiment, the minimum "Gm×R" deviates only −4.1% from the typical value and the maximum "Gm×R" deviates only +8.6% from the typical value, so that the range of variation is no more than 12.7% of the typical value, which is approximately one fifth of the conventional percentage. Accordingly, this embodiment of the present invention can stabilize the gain better than conventionally.

Second Embodiment

Figure 11:
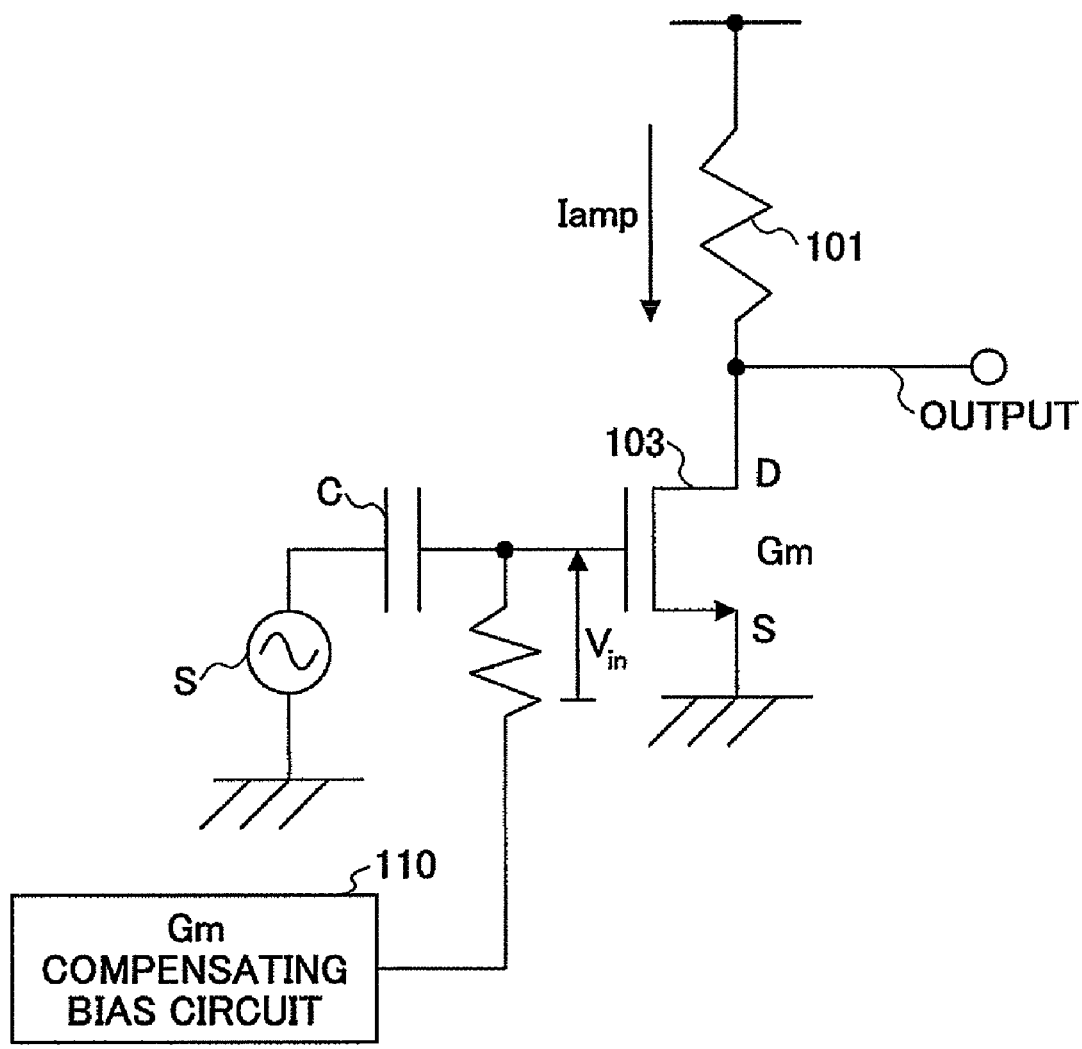
FIG. 11 is a diagram showing an amplifier according to a second embodiment of the present invention.

FIG. 11 is a diagram showing an amplifier according to a second embodiment of the present invention. The same elements as those described above are referred to by the same reference numerals. A transconductance compensating bias circuit 110 is applied to the amplifier. The transconductance compensating bias circuit 110 may be either the transconductance compensating bias circuit of FIG. 4 or the transconductance compensating bias circuit of FIG. 6 of the first embodiment.

Thus, according to one aspect of the present invention, it is possible to stabilize the bias of a field-effect transistor forming an amplifier and to stabilize the gain of the amplifier.

The present invention is not limited to the specifically disclosed embodiments, which are mere examples, and variations, modifications, alternatives, and substitutions may be made without departing from the scope of the present invention. In the above-described embodiments, specific numerical values are used to promote understanding of the present invention. However, those numerical values are mere examples and may be replaced with any appropriate values unless otherwise specified. The division of the embodiments is not essential to the present invention, and two embodiments may be used together as required. The devices according to the embodiments of the present invention are described with the corresponding functional block diagrams for convenience of description, but may be implemented by hardware, software, or a combination thereof.

The present application is based on Japanese Priority Patent Application No. 2007-277628, filed on Oct. 25, 2007, the entire contents of which are hereby incorporated by reference.

What is claimed is:

1. A transconductance compensating bias circuit compensating for a transconductance of a field-effect transistor, the transconductance compensating bias circuit comprising:
    a first field-effect transistor having a first electrode, a second electrode, and a gate connected to the first electrode, wherein a reference current flows through the first and second electrodes;
    a second field-effect transistor having a first electrode, a second electrode, and a gate connected to the gate of the first field-effect transistor, wherein a bias current flows through the first and second electrodes;
    a resistor connected to one of the second electrode of the first field-effect transistor and the second electrode of the second field-effect transistor; and
    a comparison part configured to output a signal corresponding to a result of comparison of a first potential of the first electrode of the first field-effect transistor and a second potential of the first electrode of the second field-effect transistor,
    wherein the reference current and the bias current are controlled by the output signal of the comparison part so as to equalize the first potential and the second potential.

2. The transconductance compensating bias circuit as claimed in claim 1, further comprising:
    a phase compensator circuit provided between an input and an output of the comparison part.

3. The transconductance compensating bias circuit as claimed in claim 2, wherein the phase compensator circuit comprises a capacitor.

4. The transconductance compensating bias circuit as claimed in claim 1, further comprising:
  a third field-effect transistor provided between the first electrode of the first field-effect transistor and a high potential source, the third field-effect transistor serving as a source of the reference current and being of a p-channel type; and
  a fourth field-effect transistor provided between the first electrode of the second field-effect transistor and the high potential source, the fourth field-effect transistor serving as a source of the bias current and being of the p-channel type,
  wherein the first and second field-effect transistors are of an n-channel type,
  the one of the second electrode of the first field-effect transistor and the second electrode of the second field-effect transistor is connected to a low potential source through the resistor, and another one of the second electrode of the first field-effect transistor and the second electrode of the second field-effect transistor is connected to the low potential source, and
  the output signal of the comparison part is fed to the gate of each of the third and fourth field-effect transistors.

5. The transconductance compensating bias circuit as claimed in claim 1, further comprising:
  a third field-effect transistor provided between the first electrode of the first field-effect transistor and a low potential source, the third field-effect transistor serving as a source of the reference current and being of an n-channel type; and
  a fourth field-effect transistor provided between the first electrode of the second field-effect transistor and the low potential source, the fourth field-effect transistor serving as a source of the bias current and being of the n-channel type,
  wherein the first and second field-effect transistors are of a p-channel type,
  the one of the second electrode of the first field-effect transistor and the second electrode of the second field-effect transistor is connected to a high potential source through the resistor, and another one of the second electrode of the first field-effect transistor and the second electrode of the second field-effect transistor is connected to the high potential source, and
  the output signal of the comparison part is fed to the gate of each of the third and fourth field-effect transistors.

6. The transconductance compensating bias circuit as claimed in claim 1, wherein the comparison part comprises:
  a third field-effect transistor having a gate to which one of the first potential and the second potential is applied;
  a fourth field-effect transistor having a gate to which another one of the first potential and the second potential is applied;
  a fifth field-effect transistor having an electrode connected to the fourth field-effect transistor and outputting the signal corresponding to the result of the comparison; and
  a sixth field-effect transistor having a gate connected to a gate of the fifth field-effect transistor and an electrode connected to the gate of the sixth field-effect transistor and to the third field-effect transistor.

7. An amplifier, comprising:
  an amplifier circuit having a field-effect transistor connected to a load resistor; and
  a transconductance compensating bias circuit configured to apply a bias to a gate of the field-effect transistor, wherein the transconductance compensating bias circuit includes
    a first field-effect transistor having a first electrode, a second electrode, and a gate connected to the first electrode, wherein a reference current flows through the first and second electrodes;
    a second field-effect transistor having a first electrode, a second electrode, and a gate connected to the gate of the first field-effect transistor, wherein a bias current flows through the first and second electrodes;
    a resistor connected to one of the second electrode of the first field-effect transistor and the second electrode of the second field-effect transistor; and
    a comparison part configured to output a signal corresponding to a result of comparison of a first potential of the first electrode of the first field-effect transistor and a second potential of the first electrode of the second field-effect transistor,
    wherein the reference current and the bias current are controlled by the output signal of the comparison part so as to equalize the first potential and the second potential.

8. The amplifier as claimed in claim 7, wherein the transconductance compensating bias circuit further comprises:
  a phase compensator circuit provided between an input and an output of the comparison part.

9. The amplifier as claimed in claim 7, wherein the phase compensator circuit comprises a capacitor.

10. The amplifier as claimed in claim 7, wherein the transconductance compensating bias circuit further comprises:
  a third field-effect transistor provided between the first electrode of the first field-effect transistor and a high potential source, the third field-effect transistor serving as a source of the reference current and being of a p-channel type; and
  a fourth field-effect transistor provided between the first electrode of the second field-effect transistor and the high potential source, the fourth field-effect transistor serving as a source of the bias current and being of the p-channel type,
  wherein the first and second field-effect transistors are of an n-channel type,
  the one of the second electrode of the first field-effect transistor and the second electrode of the second field-effect transistor is connected to a low potential source through the resistor, and another one of the second electrode of the first field-effect transistor and the second electrode of the second field-effect transistor is connected to the low potential source, and
  the output signal of the comparison part is fed to the gate of each of the third and fourth field-effect transistors.

11. The amplifier as claimed in claim 7, wherein the transconductance compensating bias circuit further comprises:
  a third field-effect transistor provided between the first electrode of the first field-effect transistor and a low potential source, the third field-effect transistor serving as a source of the reference current and being of an n-channel type; and
  a fourth field-effect transistor provided between the first electrode of the second field-effect transistor and the low potential source, the fourth field-effect transistor serving as a source of the bias current and being of the n-channel type,
  wherein the first and second field-effect transistors are of a p-channel type,
  the one of the second electrode of the first field-effect transistor and the second electrode of the second field-effect transistor is connected to a high potential source through the resistor, and another one of the second electrode of the first field-effect transistor and the second electrode of the second field-effect transistor is connected to the high potential source, and the output signal of the comparison part is fed to the gate of each of the third and fourth field-effect transistors.

12. The amplifier as claimed in claim 7, wherein the comparison part includes:

a third field-effect transistor having a gate to which one of the first potential and the second potential is applied;

a fourth field-effect transistor having a gate to which another one of the first potential and the second potential is applied;

a fifth field-effect transistor having an electrode connected to the fourth field-effect transistor and outputting the signal corresponding to the result of the comparison; and a sixth field-effect transistor having a gate connected to a gate of the fifth field-effect transistor and an electrode connected to the gate of the sixth field-effect transistor and to the third field-effect transistor.

\* \* \* \* \*